United States Patent
Jung

(10) Patent No.: US 7,433,250 B2
(45) Date of Patent: Oct. 7, 2008

(54) SENSE AMPLIFIER CIRCUIT

(75) Inventor: Chul M Jung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/477,164

(22) Filed: Jun. 28, 2006

(65) Prior Publication Data

US 2006/0245282 A1 Nov. 2, 2006

(51) Int. Cl.
*G11C 7/00* (2006.01)

(52) U.S. Cl. .................. 365/189.15; 365/202; 365/203

(58) Field of Classification Search ............... 365/195, 365/196, 202, 205, 203, 189.15
See application file for complete search history.

(56) References Cited

U.S. PATENT DOCUMENTS

| | | | |
|---|---|---|---|
| 4,807,195 A | 2/1989 | Busch et al. | |
| 5,283,761 A * | 2/1994 | Gillingham | 365/189.07 |
| 5,402,378 A | 3/1995 | Min et al. | |
| 5,594,691 A | 1/1997 | Bashir | |
| 5,910,926 A | 6/1999 | Hashimoto | |
| 5,973,983 A | 10/1999 | Hidaka | |
| 6,466,497 B1 * | 10/2002 | Desai et al. | 365/203 |
| 2002/0141228 A1 | 10/2002 | Fujino | |
| 2006/0023529 A1 | 2/2006 | Faue et al. | |

* cited by examiner

*Primary Examiner*—J. H. Hur
*Assistant Examiner*—Alexander Sofocleous
(74) *Attorney, Agent, or Firm*—Fletcher Yoder

(57) ABSTRACT

An equalization circuit may include a first sense amplifier having an input, the input being electrically isolated from an input to a second sense amplifier. An equalizer may be connected to the input to the first sense amplifier to provide an equalizing voltage to the input to the first sense amplifier. The input to the first sense amplifier may be equalized by the equalizing voltage independent from the input to the second sense amplifier.

18 Claims, 2 Drawing Sheets

US 7,433,250 B2

SENSE AMPLIFIER CIRCUIT

BACKGROUND OF THE INVENTION

1. Field of the Invention

This present invention relates generally to the field of integrated circuit design and, more specifically, to an improved sense amplifier circuit design.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Memory devices, such as static random access memory ("SRAM") and dynamic random access memory ("DRAM"), may include arrays of memory cells that each store a bit or element of data. Each data bit or element may represent a logical low ("0") or a logical high ("1"), which may correspond to a voltage level of a circuit element disposed within the memory cell. As an example, a voltage level close to ground may be representative a logical low or "0" and a voltage level close to a supply voltage for the memory device may be representative of a logical high or "1." The electrical paths that carry the voltage representing a bit or element of data so that it may be accessed may be referred to as a bitline.

Bitlines may be precharged before the data stored in associated memory cells is accessed. Precharging the bitline may allow faster access to the data stored in the memory cells. In precharging, the voltage level of a bitline is equalized to a voltage in between the voltage levels that correspond to logical lows and logical highs. Thus, when the bitline is accessed and begins to change voltage level to the voltage level corresponding to the data value stored therein, the voltage value on the bitline will only have to transition about half of the range between a logical low and a logical high.

Sense amplifier circuits are coupled to the bitlines to access data stored in a memory cell. A sense amplifier amplifies a signal corresponding to the difference between the voltage level of a bitline and the voltage level to which the bitline is being driven to represent a data value. When bitlines are equalized during precharging, however, the bias voltage presented to a sense amplifier may inhibit the operation of the sense amplifier, making output performance of the sense amplifier slower. Another potential problem is that some bitlines may be too long to be effectively equalized in the time available between memory access cycles. These long lines are typically on the order of 10,000 micrometers (0.01 meters) and are typically global data lines in a memory. This may be true because of the inherent resistor-capacitor ("RC") delay associated with the long lines.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
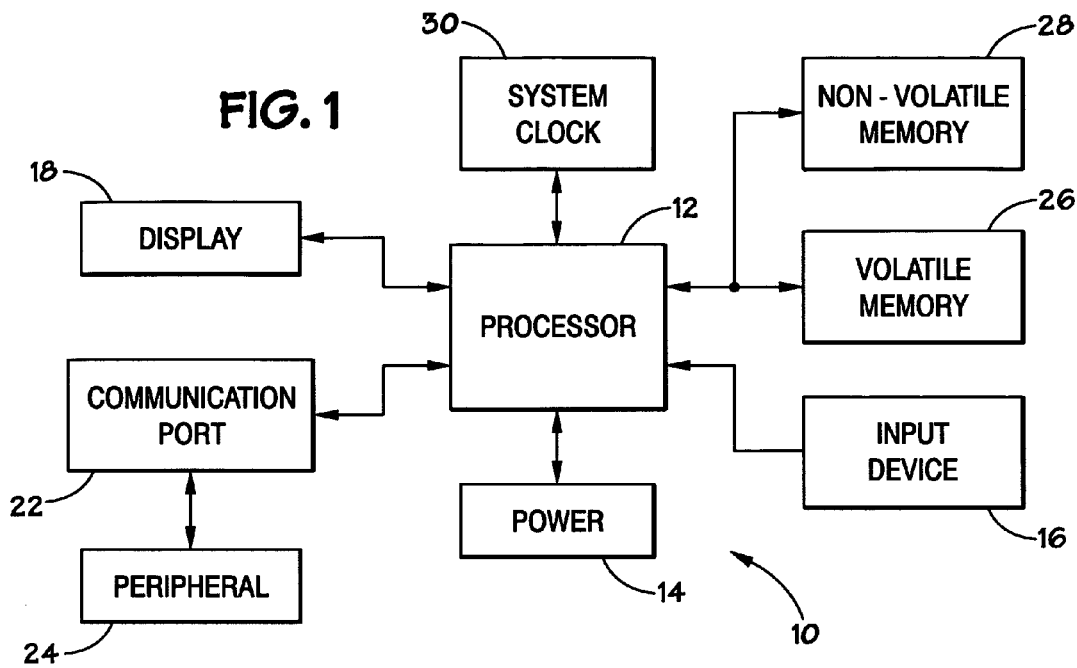
FIG. 1 is a block diagram of an electronic device containing integrated circuit devices that may employ embodiments of the present invention.

FIG. 1 is a block diagram of an electronic device containing integrated circuit devices that may employ embodiments of the present invention. The electronic device or system, which is generally referred to by the reference numeral 10, may be any of a variety of types such as a computer, pager, cellular phone, personal organizer or the like. In a processor-based device, a processor 12, such as a microprocessor, may control the operation of system functions and requests. The processor 12 may be coupled to various types of memory devices to facilitate its operation. For example the processor 12 may be connected to a volatile memory 26 and a non-volatile memory 28. The volatile memory 26 may comprise a variety of memory types, such as static random access memory ("SRAM") or dynamic random access memory ("DRAM") or the like. The non-volatile memory 28 may comprise various types of memory such as electrically programmable read only memory ("EPROM"), and/or flash memory or the like.

The system 10 may include a power supply 14, which may comprise a battery or batteries, an AC power adapter and/or a DC power adapter. Various other devices may be coupled to the processor 12 depending on the functions that the system 10 performs. For example, an input device 16 may be coupled to the processor 12 to receive input from a user. The input device 16 may comprise a user interface and may include buttons, switches, a keyboard, a light pen, a mouse, a digitizer and/or a voice recognition system or the like. An audio or video display 18 may also be coupled to the processor 12 to provide information to the user.

A communications port 22 may be adapted to provide a communication interface between the electronic device 10 and peripheral devices 24. The peripheral 24 may include a docking station, expansion bay or other external component. Furthermore, an RF sub-system/baseband processor 20 may be coupled to the processor 12 to provide wireless communication capability.

The processor 12, the non-volatile memory 28 and the volatile memory 26 may be implemented as one or more integrated circuit components. Also, the processor 12, the non-volatile memory 28, and the volatile memory 26 are examples of integrated circuit components that may include sense amplifier circuits constructed in accordance with embodiments of the present invention.

Figure 2:
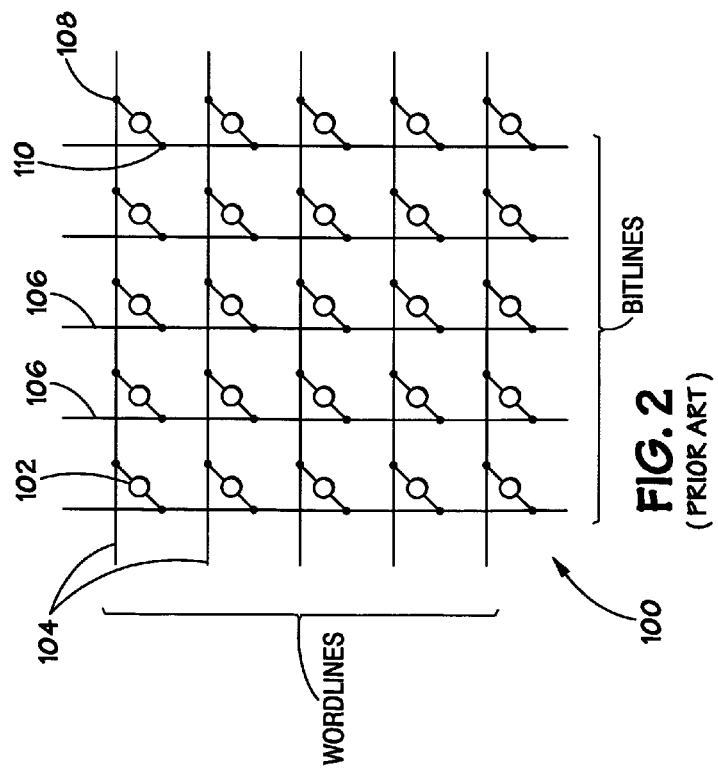
FIG. 2 illustrates a portion of a memory array that may employ embodiments of the present invention.

FIG. 2 illustrates a portion of a memory array, which may be included in one or more of the integrated circuit devices illustrated as part of the electronic device 10 in FIG. 1. The memory array is referred to generally by the reference numeral 100. As can be seen, the memory array 100 includes a plurality of memory cells 102 that are arranged in generally perpendicular rows and columns. The memory cells 102 in each row are coupled together by a respective word line 104, and the memory cells 102 in each column are coupled together by a respective bitline or digit line 106. Specifically, each memory cell 102 includes a word line node 108 that is coupled to a respective word line 104, and each memory cell 102 includes a digit line node 110 that is coupled to a respective bitline 106. The conductive word lines 104 and bitlines 106 are collectively referred to as address lines. These address lines may be electrically coupled to an integrated circuit such as a processor or memory controller so that each of the memory cells 102 can be accessed for storage and retrieval of information.

Figure 3:
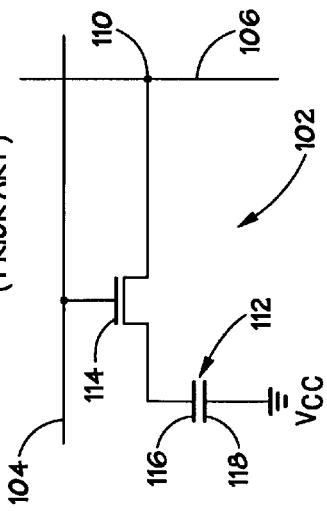
FIG. 3 illustrates an electric schematic diagram of an exemplary memory cell in the array of FIG. 2.

FIG. 3 illustrates an exemplary memory cell 102 that may be used in the memory array 100. The memory cell 102 includes a memory element 112 that may be coupled to an access device 114. The memory element 112 may be a capacitive memory element such as a storage capacitor, and the access device 114 may be a MOSFET transistor. Capacitors may be used as the storage element in DRAM or other memory types. The base of the transistor 114 may be coupled to the word line 104 to form the word line node 108, and the source of the transistor 114 may be coupled to the bitline 106 to form the bitline node 110. One plate 116 of the memory element 112 may be coupled to the drain of the transistor 114, and the other plate 118 of the memory element 112 may be coupled to a voltage level $V_{cc}$, which is typically circuit ground.

Figure 4:
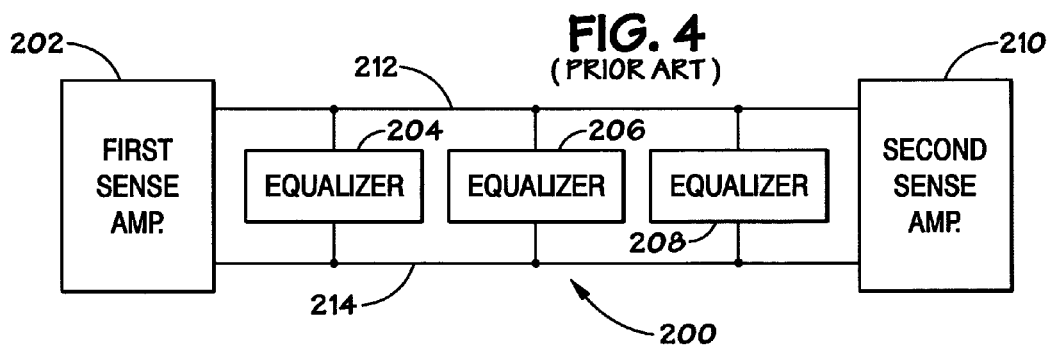
FIG. 4 is a block diagram showing a conventional sense amplifier circuit.

FIG. 4 is a block diagram showing a conventional sense amplifier circuit, which is generally referred to by the reference numeral 200. A first sense amplifier 202 and a second sense amplifier 210 are connected to each other by a bitline 212 and a bitline 214. The bitlines 212 and 214 may correspond to two of the bitlines 106 illustrated in FIG. 2. An equalizer 204, an equalizer 206, and an equalizer 208 are connected in parallel between the sense amplifier 202 and the sense amplifier 210.

The equalizers 204, 206, and 208 may be used to precharge the bitlines 212 and 214 prior to reading data from associated memory cells such as the memory cells 102 (FIG. 3). For purposes of example, the bitlines 212 and 214 may be long lines that require multiple equalizers for effective equalization at desired data access rates. The inherent RC delay in the layout of the bitlines 212 and 214 may contribute to the need for multiple equalizers to effectively precharge the inputs to the sense amplifiers 212 and 214. Even with multiple equalizers, it may be difficult to effectively equalize the bitlines 212 and 214 at high access rates. The inherent RC delay caused by the length of the bitlines may mean that effective equalization cannot occur given the relatively short equalization times that are available at high access frequencies (greater than about 200 Megahertz (MHz) core frequency).

Figure 5:
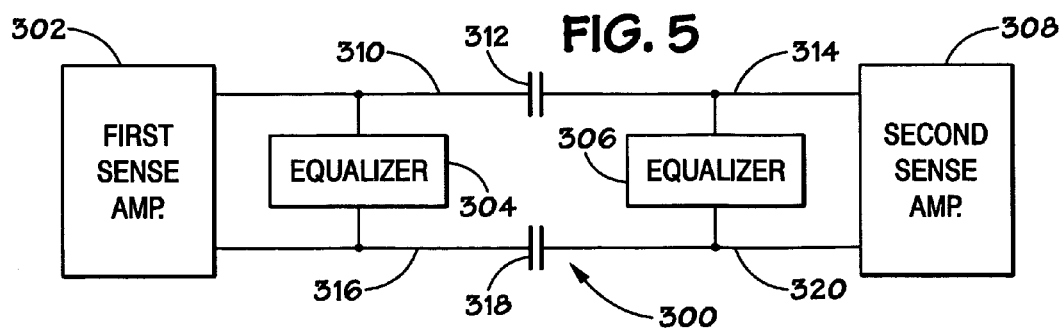
FIG. 5 is a block diagram showing a sense amplifier circuit according to an embodiment of the present invention.

FIG. 5 is a block diagram showing a sense amplifier circuit according to an embodiment of the present invention. Those of ordinary skill in the art will appreciate that, while the exemplary embodiment shown in FIG. 5 involves the equalization of bitlines in a memory device, the present invention may have applicability in any environment in which it is desirable to equalize long lines having an inherently high RC delay relative to desired performance frequencies. Those of ordinary skill in the art will appreciate the applicability of the invention to the equalization of other types of data lines, such as global data lines, in addition to bitlines. The sense amplifier circuit is generally referred to by the reference numeral 300. A first sense amplifier 302 is connected to a long bitline 310 and a long bitline 316. The long bitline 310 is capacitively coupled by a capacitor 312 to a short bitline 314, which is connected to a second sense amplifier 308. Short bitlines are typically subject to parasitic loading (resistance and capacitance), which is very small. The long bitline 316 is capacitively coupled by a capacitor 318 to a short bitline 320, which is connected to the second sense amplifier 308. The use of the capacitive coupling provided by the capacitors 312 and 318 may improve the performance of the second sense amplifier by decoupling the short bitlines 314 and 320 from the long bitlines 310 and 316. This decoupling may allow a reduction in the overall number of equalizers required for a sense amplifier circuit.

For purposes of example, the sense amplifier circuit 200 (FIG. 4) without capacitive coupling includes three equalizers 204, 206 and 208, while the sense amplifier circuit 300 includes only two equalizers 304 and 306. An equalizer 304 is connected in parallel between the long bitlines 310 and 316, and an equalizer 306 is connected in parallel between the short bitlines 314 and 320. The reduction in number of equalizers is possible because the RC delay inherent in the short bitlines 314 and 320, as well as the RC delay inherent in the long bitlines 310 and 316, is reduced. The reduction in RC delay means that fewer equalizers are needed to equalize all the bitlines 310, 314, 316 and 320 because equalization can occur in a sufficiently short time period relative to the operating frequency of the associated memory device. As an example, embodiments of the invention may allow equalization can take place without affecting operational parameters of the memory device such as read-after-write time, which is the time period that valid data is available from a memory cell after being written to the memory cell.

The capacitors 314 and 318 isolate the short bitlines 314 and 320 from DC voltage levels provided by the equalizer 304 to precharge the long bitlines 310 and 316. This isolation makes biasing the short bitlines 314 and 320 with a precharge voltage easier because precharging the short bitlines 314 and 320 may be done without regard to biasing voltages present on the long bitlines 310 and 316. Thus, maintaining the precharge level of the short bitlines 314 and 320 at optimum levels may be made easier. Because of the capacitive coupling provided by the capacitors 312 and 318, only high frequency signal components (on the order of about 318 MHz for a coupling capacitance of 0.5 picofarads and a long line resistance of 1,000 Ohms) are transferred between the long bitlines 310 and 316 and the short bitlines 314 and 320, which may already be equalized for a given read operation. This means that the performance of high frequency operations of the second sense amplifier 308 may be improved even though the long bitlines 310 and 316 may not be fully equalized.

Figure 6:
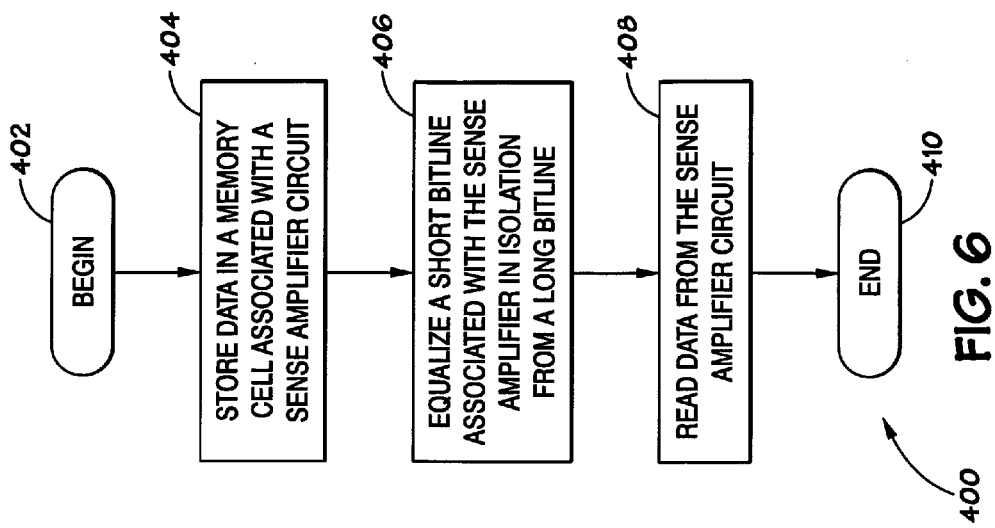
FIG. 6 is a process flow diagram showing the operation of a sense amplifier circuit in accordance with an embodiment of the present invention.

FIG. 6 is a process flow diagram showing the operation of a sense amplifier circuit in accordance with an embodiment of the present invention. The process is generally referred to by the reference numeral 400. At block 402, the process begins. At block 404, data is stored in a memory cell associated with a sense amplifier circuit. The sense amplifier circuit may correspond to the sense amplifier circuit 300 (FIG. 5). At block 406, a short bitline, which may correspond to one of the short bitlines 314 and 320 of FIG. 5, that is connected to the sense amplifier may be equalized in isolation from a long bitline, such as one of the long bitlines 310 and 316 of FIG. 5. The isolation of the short bitline may be provided by a capacitor, such as one of the capacitors 312 and 318. At block 408, data is read from the sense amplifier at block 408. As set forth above, the isolation of the short bitline may improve high frequency performance of the sense amplifier circuit by allowing the short bitline to be equalized more quickly. Additionally, the equalization of the short bitline may be made easier because the isolation of the short bitline from the long bitline may be performed independently of any DC equalization voltage present on the long bitline. At block 410, the process ends.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of accessing a memory device, comprising:
storing data in a memory cell associated with a sense amplifier circuit;
equalizing a first bitline segment associated with both the sense amplifier and a second bitline segment, wherein equalizing the first bitline segment comprises equalizing the first bitline segment isolated from the second bitline segment by a capacitor;
transmitting a signal indicative of data stored by the memory cell from the second bitline segment to the sense amplifier through the first bitline segment; and
reading the data stored by the memory cell via the sense amplifier circuit.

2. The method set forth in claim 1, wherein the recited acts are performed in the recited order.

3. The method set forth in claim 1, wherein equalizing the first bitline segment comprises equalizing the first bitline segment associated with the sense amplifier in isolation from the second bitline segment associated with the sense amplifier.

4. The method set forth in claim 1, wherein the first bitline segment is substantially shorter than the second bitline segment.

5. The method set forth in claim 1, wherein reading data comprises amplifying a signal corresponding to a difference between an equalized voltage level of the first bitline segment and a voltage level to which the bitline is being driven to represent a data value.

6. The method set forth in claim 1, comprising equalizing the first bitline segment in isolation from the second bitline segment both before and after reading data from the memory cell.

7. A method of operating a memory device, comprising:
isolating a sense amplifier from a first bitline signal having a first frequency; and
transmitting a second bitline signal having a second frequency to the sense amplifier, wherein the second frequency is substantially higher than the first frequency.

8. The method set forth in claim 7, wherein the first bitline signal is a direct current signal from an equalizer and the first frequency is approximately zero.

9. The method set forth in claim 7, wherein the second frequency is greater than 318 MHz.

10. The method set forth in claim 7, wherein the second bitline signal is from a capacitive memory element.

11. The method set forth in claim 7, wherein transmitting comprises transmitting between plates of a capacitor by capacitively coupling a first bitline segment connected to a memory element and a second bitline segment connected to the sense amplifier.

12. The method set forth in claim 7, comprising independently precharging a first bitline segment coupled to a memory element and a second bitline segment coupled to the sense amplifier.

13. The method set forth in claim 7, comprising receiving a data value corresponding to the second bitline signal in a processor.

14. A method, comprising:
charging a first bitline segment;
charging a second bitline segment; and
transmitting a signal indicative of data from the first bitline segment to the second bitline segment through a high-pass filter.

15. The method of claim 14, wherein transmitting a signal indicative of data from the first bitline segment to the second bitline segment through a high-pass filter comprises transmitting the signal indicative of data through a capacitor coupled to both the first bitline segment and the second bitline segment.

16. The method of claim 14, comprising preventing current from flowing between the first bitline segment and the second bitline segment while charging the first bitline segment.

17. The method of claim 14, comprising switchably connecting the second bitline segment to a data source.

18. The method of claim 17, wherein the data source is a memory device.

* * * * *

UNITED STATES PATENT AND TRADEMARK OFFICE
CERTIFICATE OF CORRECTION

| | | |
|---|---|---|
| PATENT NO. | : 7,433,250 B2 | Page 1 of 1 |
| APPLICATION NO. | : 11/477164 | |
| DATED | : October 7, 2008 | |
| INVENTOR(S) | : Jung | |

It is certified that error appears in the above-identified patent and that said Letters Patent is hereby corrected as shown below:

On the title page, in column 1, line 2, below "US 2006/0245282 A1 Nov. 2, 2006" insert -- Related U.S. Application Data
Division of application No. 10/681,929, filed on Oct. 09, 2003, now Pat. No. 7,133,321. --.

In column 1, line 2, above "BACKGROUND OF THE INVENTION" insert
-- CROSS-REFERENCE TO RELATED APPLICATION
This application is a division of U.S. patent application Ser. No. 10/681,929, filed Oct. 09, 2003, now U.S. Pat. No. 7,133,321. --.

Signed and Sealed this

Seventeenth Day of March, 2009

JOHN DOLL
*Acting Director of the United States Patent and Trademark Office*